United States Patent
Diao et al.

(10) Patent No.: US 11,107,693 B2
(45) Date of Patent: *Aug. 31, 2021

(54) METHOD FOR HIGH ASPECT RATIO PHOTORESIST REMOVAL IN PURE REDUCING PLASMA

(71) Applicants: Beijing E-Town Semiconductor Technology, Co., LTD, Beijing (CN); Mattson Technology, Inc., Fremont, CA (US)

(72) Inventors: Li Diao, Fremont, CA (US); Robert George Elliston, San Jose, CA (US); David Gilbert, Pflugerville, TX (US); Chan-Yun Lee, Fremont, CA (US); James Paris, McKinney, TX (US); HaiAu PhanVu, San Jose, CA (US); Tom Tillery, Phoenix, AZ (US); Vijay Matthew Vaniapura, Tracy, CA (US)

(73) Assignees: Beijing E-Town Semiconductor Technology Co., Ltd., Beijing; Mattson Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/587,439

(22) Filed: Sep. 30, 2019

(65) Prior Publication Data
US 2020/0098576 A1 Mar. 26, 2020

Related U.S. Application Data

(63) Continuation of application No. 14/406,256, filed as application No. PCT/US2013/050674 on Jul. 16, 2013, now Pat. No. 10,431,469.

(Continued)

(51) Int. Cl.
*H01L 21/3065* (2006.01)
*H01L 21/02* (2006.01)
(Continued)

(52) U.S. Cl.
CPC .......... *H01L 21/3065* (2013.01); *G03F 7/427* (2013.01); *H01J 37/321* (2013.01);
(Continued)

(58) Field of Classification Search
CPC .......... H01L 21/3065; H01L 21/02068; H01L 21/31138; H01L 21/02057; G03F 7/427;
(Continued)

(56) References Cited

U.S. PATENT DOCUMENTS

| 6,028,015 A | 2/2000 | Wang |
| 6,536,449 B1 | 3/2003 | Ranft |

(Continued)

FOREIGN PATENT DOCUMENTS

| JP | S 60474223 | 3/1985 |
| JP | 2002 110613 | 4/2002 |

(Continued)

OTHER PUBLICATIONS

Abstract of Japanese Patent—JP2005217373, Aug. 11, 2005, 2 pages.

(Continued)

*Primary Examiner* — Alexander Markoff
(74) *Attorney, Agent, or Firm* — Dority & Manning. P. A.

(57) ABSTRACT

A method for removing photoresist, an oxidation layer, or both from a semiconductor substrate is disclosed. The method includes placing a substrate in a processing chamber, the processing chamber separate from a plasma chamber for generating a non-oxidizing plasma to be used in treating the substrate; generating a first non-oxidizing plasma from a first reactant gas and a first carrier gas in the plasma (Continued)

chamber, wherein the first non-oxidizing plasma comprises from about 10% to about 40% of the first reactant gas, wherein the first reactant gas has a flow rate of from about 100 standard cubic centimeters per minute to about 15,000 standard cubic centimeters per minute, and wherein the first carrier gas has a flow rate of from about 500 standard cubic centimeters per minute to about 20,000 standard cubic centimeters per minute; and treating the substrate by exposing the substrate to the first non-oxidizing plasma in the processing chamber.

12 Claims, 5 Drawing Sheets

Related U.S. Application Data

(60) Provisional application No. 61/702,865, filed on Sep. 19, 2012, provisional application No. 61/671,996, filed on Jul. 16, 2012.

(51) Int. Cl.
 *H01L 21/311* (2006.01)
 *G03F 7/42* (2006.01)
 *H01J 37/32* (2006.01)

(52) U.S. Cl.
 CPC .. *H01J 37/32449* (2013.01); *H01L 21/02068* (2013.01); *H01L 21/31138* (2013.01); *H01J 2237/334* (2013.01)

(58) Field of Classification Search
 CPC .............. H01J 37/321; H01J 37/32449; H01J 2237/334
 See application file for complete search history.

(56) References Cited

U.S. PATENT DOCUMENTS

| | | | |
|---|---|---|---|
| 6,551,447 B1 | 4/2003 | Savas | |
| 6,593,660 B2 | 7/2003 | Buchwalter et al. | |
| 6,630,046 B1 | 10/2003 | Plotz | |
| 6,630,406 B2 | 10/2003 | Waldfried et al. | |
| 6,849,559 B2 | 2/2005 | Balasubramaniam et al. | |
| 7,001,848 B1 | 2/2006 | Smith et al. | |
| 7,361,605 B2 | 4/2008 | Savas | |
| 7,563,705 B2 | 7/2009 | Tonegawa | |
| 7,695,567 B2 | 4/2010 | Fu | |
| 7,790,047 B2 | 9/2010 | Huang | |
| 8,075,360 B2 | 12/2011 | Teramoto | |
| 10,431,469 B2 * | 10/2019 | Diao | H01J 37/321 |
| 2001/0027016 A1 | 10/2001 | Han | |
| 2003/0032300 A1 | 2/2003 | Waldfried et al. | |
| 2003/0165617 A1 | 9/2003 | Kagadei | |
| 2004/0256351 A1 | 12/2004 | Chung | |
| 2005/0196967 A1 | 9/2005 | Savas | |
| 2007/0190266 A1 | 8/2007 | Fu | |
| 2007/0269721 A1 | 11/2007 | Kim | |
| 2008/0132078 A1 | 6/2008 | Yamazaki | |
| 2009/0078675 A1 | 3/2009 | McReynolds et al. | |
| 2011/0027999 A1 | 2/2011 | Sparks et al. | |
| 2011/0136346 A1 | 6/2011 | Geissbühler et al. | |
| 2011/0189847 A1 | 8/2011 | Tsai | |
| 2020/0098576 A1 * | 3/2020 | Diao | H01L 21/31138 |

FOREIGN PATENT DOCUMENTS

| | | |
|---|---|---|
| JP | 2002 217199 | 8/2002 |
| JP | 2003 035962 | 2/2003 |
| JP | 2005 183778 | 7/2005 |
| JP | 2007 149788 | 6/2007 |
| JP | 2009 239210 | 10/2009 |
| WO | WO9934424 | 7/1999 |
| WO | WO 2011/072061 | 6/2011 |
| WO | WO2011/121166 | 10/2011 |
| WO | WO 2013028313 | 2/2013 |

OTHER PUBLICATIONS

Abstract of Japanese Patent—JP2009054744, Mar. 12, 2009, 2 pages.
Article—Govindarajan et al., "Investigation of Galvanic Corrosion Characteristics between Tantalum Nitride and Poly Silicon in Dilute HF Solutions," ECS Trans., 2011, vol. 41, Issue 5, pp. 15-21.
Article—Luo et al., "Study of Alternative Plasma Strip Techniques for Advanced Photoresist Removal," ECS Trans., 2010, vol. 7, Issue 1, pp. 725-729.
Article—Luo et al., "Study of Controlled Oxygen Diffusion Approaches for Advanced Photoresist Strip," Solid State Phenomena, vol. 187, 2012, pp. 93-96 (Axcelis Technologies, Inc. Beverly, MA).
Article—Jerzy Ruzyollo, "Semiconductor Surface Cleaning and Conditioning Challenges Beyond Planar Silicon Technology," ECS Trans., 2007, vol. 9, Issue 1, pp. 87-95.
Article—Schram et al., "Cleaning and Strip Requirement for Metal Gate Based CMOS Integration," ECS Trans., 2009, vol. 25, Issue 5, pp. 17-28.
Article—Vos et al., "Challenges with Respect to High-k/Metal Gate Stack Etching and Cleaning," ECS Trans., 2007, vol. 11, Issue 4, pp. 275-283.
International Search Report and Written Opinion for PCT/US2013/050674 dated Oct. 21, 2013, 8 pages.

* cited by examiner

METHOD FOR HIGH ASPECT RATIO PHOTORESIST REMOVAL IN PURE REDUCING PLASMA

PRIORITY CLAIMS

This application is a continuation of U.S. patent application Ser. No. 14/406,256, filed Dec. 8, 2014, which claims the benefit of and priority to the national stage entry of International Application No. PCT/US2013/050674, filed Jul. 16, 2013, which claims the benefit of priority of U.S. Provisional Patent Application No. 61/671,996, filed Jul. 16, 2012, and U.S. Provisional Patent Application No. 61/702,865, filed Sep. 19, 2012, all of which are incorporated herein by reference for all purposes.

FIELD

The present disclosure relates generally to the removal of photoresist and, more particularly, to a process that can remove photoresist in high aspect ratio (HAR) applications.

BACKGROUND

In the semiconductor industry, the patterns of conductors on circuit boards and the transistors on microchips are printed or etched onto substrates or wafers using a photoresist. For instance, many millions of micron-sized devices can be fabricated simultaneously and reliably on silicon substrates via the application of a layer or multiple layers of photoresist. A photoresist is a polymeric coating that can change properties upon exposure to light and that can resist etching, ion implantation, metal deposition, etc., to protect the substrate beneath where required. For example, in a situation where a chemical treatment etches away some of the substrate, the photoresist can protect the other regions of the substrate, after which an appropriate reagent such as plasma is utilized to remove or strip the remaining photoresist.

However, as the device feature size of integrated circuits continues to be scaled down, removal or stripping of the photoresist becomes more difficult, particularly in high aspect ratio (HAR) applications where the ratio of the length of an object to its width is greater than about 25, such as greater than about 50 (i.e., when the ratio of the height of a cavity to the width of a cavity is greater than about 25, such as greater than about 50), or in applications where the critical dimension (CD) of the substrate becomes smaller. Further, photoresist removal with zero substrate loss while simultaneously maintaining gate material integrity is critical with high dose implant strip (HDIS) and descum processes.

One solution as it pertains to conventional oxygen-based plasma stripping is to increase power into the plasma. However, this results in oxidation damage, for example, to the metallic liner coating the inside surfaces of HAR holes. Such oxidation, in turn, results in increased sheet resistance and is prevalent when oxygen-rich reducing chemistry is used in conjunction with high-k metal gates (HKMGs), thus negating the electrical advantages seen with the use of HKMGs. Further, removal of the oxidized layer results in severe CD change and loss of contact liner thickness, which is already thin.

Meanwhile, the use of pure reducing chemistry is well established when stripping photoresist in the presence of metallic surfaces, but it has intrinsically low photoresist removal rates, even at high power, and typically, purely reducing plasmas have an order of magnitude lower strip rate than oxygen-based plasmas of equal power and gas feed density. Moreover, residual photoresist is often left at the bottom of the HAR holes, even when the process time is extended many times beyond that required to strip a monolithic photoresist film of equal thickness. The different behavior is presumed to be due to the loss of reactive species to surface reactions along the container walls of the HAR holes, thus preventing sufficient reactant density at the surface of the holes.

Thus, a need exists for a method of removing photoresist in an economically feasible manner that results in minimal to zero substrate loss and does not result in the oxidation of the metallic lining in such holes. A need also exists for a process for oxidized layer removal from conductive materials that does not result in thickness loss.

SUMMARY

Aspects and advantages of the invention will be set forth in part in the following description, or may be obvious from the description, or may be learned through practice of the invention.

One exemplary aspect of the present disclosure is directed to a method for removing photoresist, an oxidation layer, or both from a semiconductor substrate. The method comprises placing a substrate in a processing chamber, the processing chamber located downstream from a plasma chamber for generating a non-oxidizing plasma to be used in treating the substrate; generating a first non-oxidizing plasma from a first reactant gas and a first carrier gas in the plasma chamber, wherein the first non-oxidizing plasma comprises from about 10% to about 40% of the first reactant gas, wherein the first reactant gas has a flow rate of from about 0.05 standard cubic centimeters per minute per square centimeter of the substrate to about 12.5 standard cubic centimeters per minute per square centimeter of the substrate, and wherein the first carrier gas has a flow rate of from about 0.25 standard cubic centimeters per minute per square centimeter of the substrate to about 15 standard cubic centimeters per minute per square centimeter of the substrate; and treating the substrate by exposing the substrate to the first non-oxidizing plasma in the processing chamber.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure, including the best mode, to one of ordinary skill in the art, is set forth more particularly in the remainder of the specification, including reference to the accompanying figures, in which.

DETAILED DESCRIPTION

Figure 1:
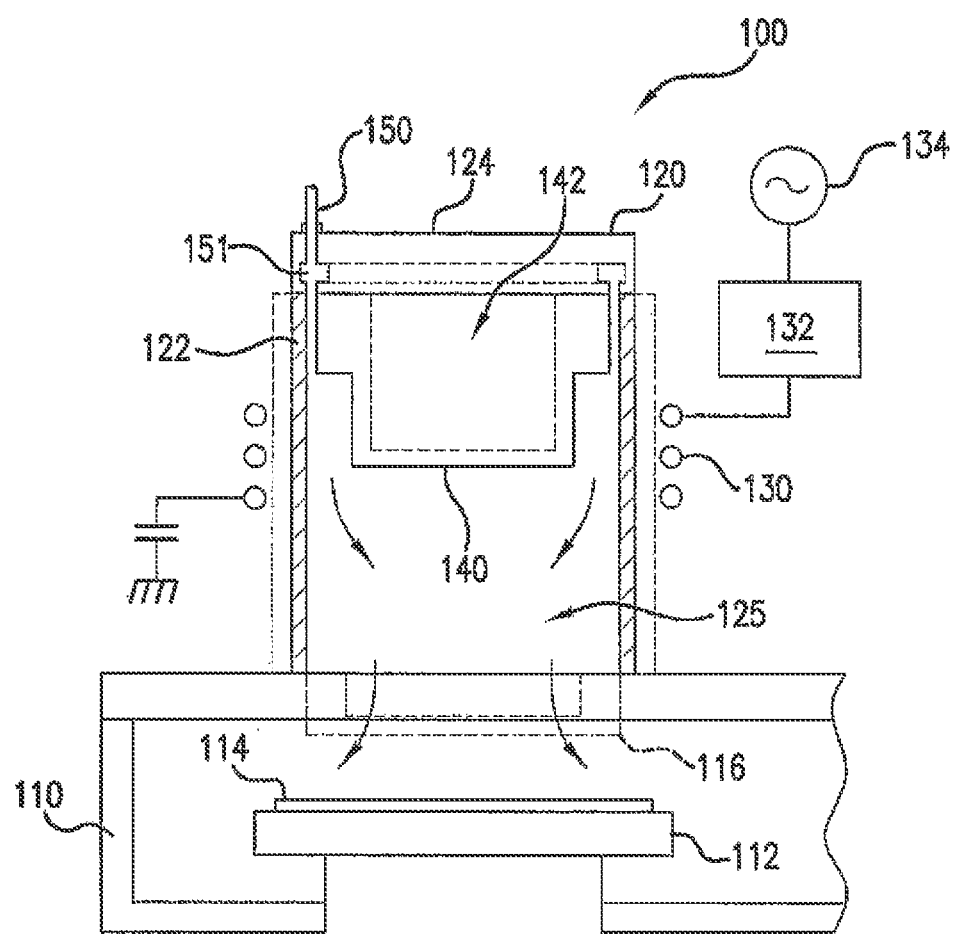
FIG. 1 depicts a plasma reactor that can be used in the methods embodied by the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to a method of removing photoresist, an oxidized layer, or both from a substrate using a non-oxidizing plasma chemistry supplied via a downstream inductively coupled plasma source. Inductive plasma sources are often used for plasma processing to produce high density plasma and reactive species for processing wafers. For instance, inductive plasma sources can easily produce high density plasma using standard 13.56 MHz and lower frequency power generators. Inductive plasma sources combined with RF bias have also been used in etchers, for example, to provide independent control of ion energy and ion flux to the wafer.

For certain plasma processes such as processes for photoresist or oxidized layer removal, it is generally not desirable to expose the semiconductor wafers directly to the plasma. The plasma is formed remotely (e.g., downstream) from the processing chamber and desired particles are channeled to the semiconductor wafer or substrate, for example, through a grid that is transparent to neutral particles and not transparent to the plasma. Such processes can require high RF power (e.g., up to about 6 kilowatts (kW)) and in some cases high gas flows (e.g., about 20,000 standard cubic centimeters per minute (sccm)) and high pressure (e.g., up to about 5000 milliTorr (mTorr)), when treating two substrates each having an overall diameter of about 300 millimeters (mm).

It is to be understood, however, that when only a single substrate is treated, the flow rate can generally be half of the flow rate required for treating two substrates. Further, it is also to be understood that substrates having diameters of from about 100 mm to about 500 mm, such as from about 200 mm to about 450 mm, can also be treated using the methods embodied by the present disclosure, where the RF power and flow rates can be adjusted based on the surface area of the substrate. For instance, when a single 200 mm diameter substrate is treated instead of a single 300 mm diameter substrate, based on the ratio of the surface area of the substrates, the flow rates utilized should be about 0.44 times of the flow rates used for a 300 mm substrate, while when a 450 mm diameter substrate is treated, the flow rates utilized should be about 2.25 times the flow rates used for a 300 mm substrate.

FIG. 1 depicts a plasma reactor 100 that can be used in the methods embodied by the present disclosure, although it is to be understood that any other suitable reactor having a downstream inductively coupled plasma source can also be utilized. As illustrated, plasma reactor 100 includes a processing chamber 110 and a plasma chamber 120 that is separate from the processing chamber 110. Processing chamber 110 includes a substrate holder or pedestal 112 operable to hold a substrate 114 from which photoresist is to be removed, such as a semiconductor wafer. An inductive plasma is generated in plasma chamber 120 (i.e., plasma generation region) and desired particles are channeled from the plasma chamber 120 to the surface of substrate 114 through holes provided in a grid 116 that separates the plasma chamber 120 from the processing chamber 110 (i.e., downstream region).

The plasma chamber 120 includes a dielectric side wall 122 and a ceiling 124. The dielectric side wall 122 and ceiling 124 define a plasma chamber interior 125. Dielectric side wall 122 can be formed from any dielectric material, such as quartz. An induction coil 130 is disposed adjacent the dielectric side wall 122 about the plasma chamber 120. The induction coil 130 is coupled to an RF power generator 134 through a suitable matching network 132. Reactant and carrier gases can be provided to the chamber interior from gas supply 150 and annular gas distribution channel 151. When the induction coil 130 is energized with RF power from the RF power generator 134, a substantially inductive plasma is induced in the plasma chamber 120. In a particular embodiment, the plasma reactor 100 can include an optional faraday shield 128 to reduce capacitive coupling of the induction coil 130 to the plasma.

To increase efficiency, the plasma reactor 100 can optionally include a gas injection insert 140 disposed in the chamber interior 125. The gas injection insert 140 can be removably inserted into the chamber interior 125 or can be a fixed part of the plasma chamber 120. In some embodiments, the gas injection insert can define a gas injection channel proximate the side wall of the plasma chamber. The gas injection channel can feed the process gas into the chamber interior proximate the induction coil and into an active region defined by the gas injection insert and side wall. The active region provides a confined region within the plasma chamber interior for active heating of electrons. The narrow gas injection channel prevents plasma spreading from the chamber interior into the gas channel. The gas injection insert forces the process gas to be passed through the active region where electrons are actively heated.

Regardless of the type of downstream inductively coupled plasma source utilized in the methods of the present disclosure, the present inventors have discovered that one or more non-oxidizing plasma treatments with one or more plasma chemistries can be carried out on a semiconductor substrate to increase the amount of photoresist removed from the substrate while at the same time minimizing the amount of oxidation and change in critical dimension (CD). Generally, the plasmas used in the treatment processes of the present disclosure are non-oxidizing. The methods of the present disclosure allow for photoresist removal and the prevention or removal of surface oxidation. For instance, in one embodiment, a method is described that can be carried out on silicon surfaces that must not be oxidized during the photoresist stripping process. The method can also be carried out on HAR trenches or any other cavity with a lateral dimension that is small relative to the depth of the cavity in the substrate. In other embodiments, the present disclosure describes a method that includes a main plasma treatment to remove photoresist, followed by a second plasma treatment to remove oxidation while minimizing the amount of substrate loss or modification.

Regardless of the number and specific type of plasma treatments, the one or more plasmas used in treating a substrate can each include a reactant gas and a carrier gas, which are both free of oxygen. In certain embodiments, the reactant gas can include hydrogen, while the carrier gas can be free of hydrogen. For instance, the reactant gas can be hydrogen ($H_2$), ammonia ($NH_3$), or methane ($CH_4$). In other embodiments, the reactant gas can be free of both oxygen and nitrogen. For instance, the reactant gas can be $H_2$ or $CH_4$. Meanwhile, the carrier gas can include an inert gas. In certain embodiments, the inert gas can include nitrogen ($N_2$) or noble gases such as argon (Ar) or helium (He), or combinations thereof. In other embodiments, however, the carrier gas can be an inert gas that is free of nitrogen, such as one of the noble gases. Generally, the reactant gas can be present in an amount that is from about 10% to about 40% of the total gas volume of the reactant gas and the carrier gas, such as from about 15% to about 30% of the total gas volume of the reactant gas and the carrier gas, such as from about 20% to about 25% of the total gas volume of the reactant gas and the carrier gas. In one particular embodiment, the reactant gas can be present in an amount that is about 20% of the total gas volume of the reactant gas and the carrier gas.

The reactant gas and the carrier gas can be introduced into the plasma generation chamber and processing chamber at various flow rates. For instance, when two 300 mm substrates are being treated, the reactant gas can have a flow rate of from about 100 to about 15,000 sccm, such as from about 1,000 sccm to about 10,000 sccm, such as from about 2,000 sccm to about 5,000 sccm. Meanwhile, the carrier gas can have a flow rate of from about 500 sccm to about 20,000 sccm, such as from about 5,000 sccm to about 17,500 sccm, such as from about 10,000 sccm to about 15,000 sccm. On the other hand, when only a single 300 mm substrate is being treated, the reactant gas can have a flow rate of from about 50 to about 7,500 sccm, such as from about 500 to about 5,000 sccm, such as from about 1,000 to about 2,500 sccm. Meanwhile, when only a single 300 mm substrate is being treated, the carrier gas can have a flow rate of from about 250 sccm to about 10,000 sccm, such as from about 2,500 sccm to about 8,750 sccm, such as from about 5,000 sccm to about 7,500 sccm.

Based on the surface area of the substrate (e.g., a single 300 mm diameter substrate having a surface area of about 706.5 centimeters squared ($cm^2$), this corresponds with a reactant gas that has a flow rate of from about 0.07 sccm per $cm^2$ of substrate to about 10.75 sccm per $cm^2$ of substrate, such as from about 0.7 sccm per $cm^2$ of substrate to about 7.25 sccm per $cm^2$ of substrate, such as from about 1.25 to about 3.5 sccm per $cm^2$ of substrate. Meanwhile, this corresponds with a carrier gas that has a flow rate of from about 0.35 sccm per $cm^2$ of substrate to about 14.25 sccm per $cm^2$ of substrate, such as from about 3.5 sccm per $cm^2$ of substrate to about 12.5 sccm per $cm^2$ of substrate, such as from about 7.0 sccm per $cm^2$ of substrate to about 10.75 sccm per $cm^2$ of substrate. Using the flow rates in sccm per $cm^2$ of substrate, then the flow rates in sccm for substrates having any diameter can be determined by multiplying the sccm per $cm^2$ of substrate rate by the surface area of the substrate.

For instance, when a single, 200 mm substrate is treated, the reactant gas can have a flow rate of from about 20 to about 3,300 sccm, such as from about 220 to about 2,200 sccm, such as from about 440 to about 1,100 sccm. On the other hand, the carrier gas can have a flow rate of from about 110 to about 4,400 sccm, such as from about 1,100 sccm to about 3850 sccm, such as from about 2,200 sccm to about 3,300 sccm.

Meanwhile, when a single, 450 mm substrate is treated, the reactant gas can have a flow rate of from about 110 sccm to about 16,875 sccm, such as from about 1,125 sccm to about 11,250 sccm, such as from about 2,250 sccm to about 5,625 sccm. On the other hand, the carrier gas can have a flow rate of from about 560 sccm to about 22,500 sccm, such as from about 5,625 sccm to about 19,675 sccm, such as from about 11,250 sccm to about 16,875 sccm.

Further, photoresist removal can be carried out at varying temperature and power levels. For example, the temperature during photoresist removal can range from about 150° C. to about 350° C., such as from about 200° C. to about 325° C., such as from about 250° C. to about 300° C. In one particular embodiment, the photoresist removal can be carried out at a temperature of about 275° C. Additionally, the RF source power for treating 300 mm diameter substrates can range from about 1 kW to about 6 kW, such as from about 1.5 kW to about 5.5 kW, such as from about 2 kW to about 5 kW. Meanwhile, it is to be understood that the source power can be adjusted up or down based on the surface area of the substrate to be treated in the same manner as discussed above for the reactant and carrier gas flow rates. Thus, for treating a substrate, the source power can range from about 0.4 kW to about 13.5 kW, such as from about 0.6 kW to about 12.5 kW, such as from about 0.8 kW to about 11.5 kW, when the substrate.

Moreover, photoresist removal can be carried out at varying pressures. For instance, the pressure can range from about 100 mTorr to about 4,000 mTorr, such as from about 250 mTorr to about 3,500 mTorr, such as from about 500 mTorr to about 2,500 mTorr, such as from about 750 mTorr to about 1,000 mTorr. In one particular embodiment, the pressure can be about 900 mTorr.

In addition, during photoresist removal, the substrate from which the photoresist is to be removed can be treated for a specified time based on the CD and aspect ratio of any holes, cavities, or channels in the substrate to be treated. For instance, the processing time can range from about 10 seconds to about 180 seconds, such as from about 20 seconds to about 90 seconds, such as from about 30 seconds to about 60 seconds. In one particular embodiment, the processing time can be about 45 seconds, such as when the substrate to be treated has holes, cavities, or channels having an aspect ratio of greater than 50 and a critical dimension less than 0.03 micrometers.

The present inventors have discovered certain processing conditions based on the combinations of reactant gases and carrier gases uses in forming the plasma. For example, when the reactant gas is either 20% $NH_3$ or 20% $H_2$ and the carrier gas is $N_2$, the substrate can be treated for about 45 seconds at a temperature of about 275° C., a pressure of about 900 mTorr, and a source power of 5 kW, where the reactant gas has a flow rate of 3,000 sccm and the carrier gas has a flow rate of 12,000 sccm. Meanwhile, when the reactant gas is either 20% $H_2$ and the carrier gas is Ar, the substrate can be treated for about 45 seconds at a temperature of about 275° C., a pressure of about 900 mTorr, and a source power of 5 kW, where the reactant gas has a flow rate of 2,500 sccm and the carrier gas has a flow rate of 10,000 sccm.

After a substrate has been treated one or more times with a plasma generated under the conditions discussed above to remove photoresist, the substrate can be evaluated to determine its increase in sheet resistance. The larger the percent increase in sheet resistance coincides with a larger amount of oxidation or damage to the substrate after photoresist strip removal. As such, it is more desirable to have a lower percent change in sheet resistance than a higher percent change in sheet resistance. After photoresist is removed from a substrate according to the method of the present claims, the sheet resistance generally changes by only about 5% or less. For instance, the change in sheet resistance can range from about 0.1% to about 4%, such as from about 0.5% to about 4%, such as from about 1% to about 3%. Further, the substrate, after one or more plasma treatments, can have a decrease in thickness that is less than about 0.75 nanometers. In some embodiments, the decrease in thickness ranges from about 0.05 nanometers to about 0.6 nanometers, such as from about 0.075 nanometers to about 0.5 nanometers, such as from about 0.1 nanometers to about 0.4 nanometers, such as less than about 0.3 nanometers. These minimal changes indicate that the method of the present disclosure can efficiently remove photoresist and possible oxidation layers without damaging or removing material from the substrate itself.

The photoresist and oxidation removal methods defined by the parameters discussed above can be carried out on numerous substrate materials. For instance, the process can be applied to a HAR substrate where the substrate has holes, cavities, or channels having an aspect ratio (height of cavity/diameter of cavity) that is greater than 50 and having a diameter as small as about 0.03 micrometers. Traditionally, it is difficult to remove photoresist from such holes, cavities, or channels. However, as shown in the examples below and in contrast to what would be expected, by combining a reactant gas (i.e., a hydrogen-containing gas) with a separate, inert carrier gas, the present inventors have found that more effective photoresist removal from HAR holes can result when compared to removal via the hydrogen-containing reactant gas alone. Further, using the reactant gas and carrier gas method of the present can prevent damage to oxygen-sensitive HAR holes while still remaining efficient.

The photoresist removal method of the present disclosure can also be extended to other applications where surface oxidation is a concern and should be prevented and where high photoresist removal is needed. For instance, the method of the present disclosure can be used in the presence of silicon surfaces that must not be oxidized by the photoresist stripping process. Other conductive materials on which the method of the present disclosure can be applied include titanium nitride (TiN), tantalum nitride (TaN), copper (Cu), tungsten (W), or any material having the formula $M_xN_y$, where M is a metal, x and y are positive integers, and N is nitrogen, as such materials are also sensitive to oxygen exposure. The method can also be used for HDIS photoresist strip and photoresist strip on metal where metal material is exposed during photoresist removal or descum photoresist removal. Further, the method can be used to remove an oxidation layer on conductive materials with minimal modification (i.e., little change in thickness) of the material.

Figure 2:
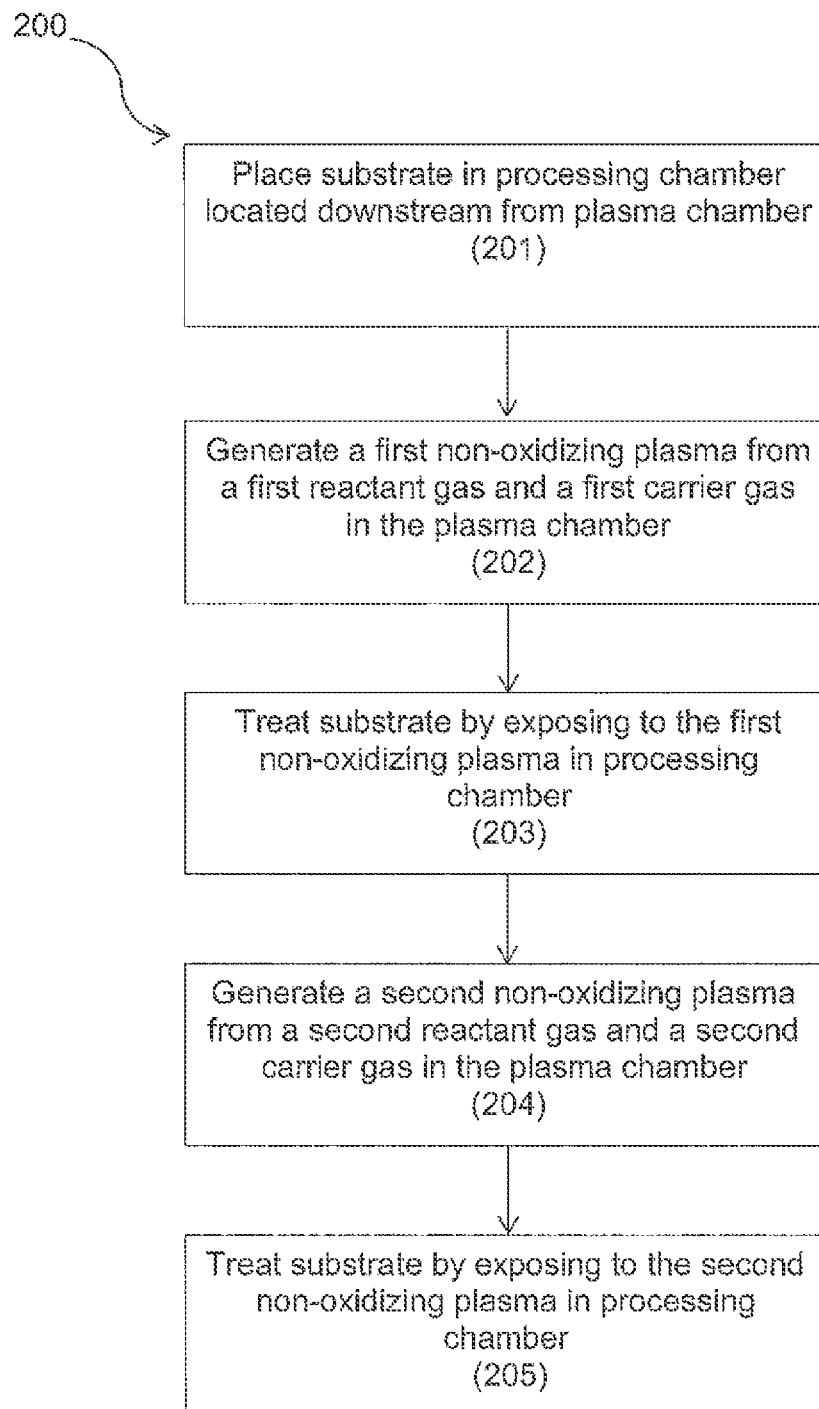
FIG. 2 depicts a flow diagram of a method for removing photoresist as embodied by the present disclosure.

The method by which photoresist and oxidation can be removed can be carried out in the plasma reactor discussed above in reference to FIG. 1 or with any other suitable plasma reactor that may have an alternatively shaped gas injection insert. Generally, as shown in the block diagram of FIG. 2, a method 200 for removing photoresist, an oxidation layer, or both from a semiconductor substrate can include placing a substrate in a processing chamber of a plasma reactor that is located downstream from a plasma chamber (201), generating a first non-oxidizing plasma from a first reactant gas and a first carrier gas in the plasma chamber of the plasma reactor (202), and treating the substrate by exposing the substrate to the first non-oxidizing plasma in the processing chamber (203). The first non-oxidizing plasma can include from about 10% to about 40% of the first reactant gas. Further, the first reactant gas can have a flow rate of from about 100 standard cubic centimeters per minute to about 15,000 standard cubic centimeters per minute and the first carrier gas can have a flow rate of from about 500 standard cubic centimeters per minute to about 20,000 standard cubic centimeters per minute.

The method can further include a second plasma treatment step where a second non-oxidizing plasma can be generated from a second reactant gas and a second carrier gas in the plasma chamber (204). The second non-oxidizing plasma can also include from about 10% to about 40% of the second reactant gas. Further, the second reactant gas can have a flow rate of from about 100 standard cubic centimeters per minute to about 15,000 standard cubic centimeters per minute, and the second carrier gas can have a flow rate of from about 500 standard cubic centimeters per minute to about 20,000 standard cubic centimeters per minute. In the second plasma treatment step, the substrate can be treated by exposing the substrate to the second non-oxidizing plasma in the processing chamber (205).

Aspects of the present disclosure may be better understood by reference to the following examples, which refer to FIGS. 3-7 and demonstrate the effectiveness of the photo resist removal methods discussed above.

Example 1

Figure 3:
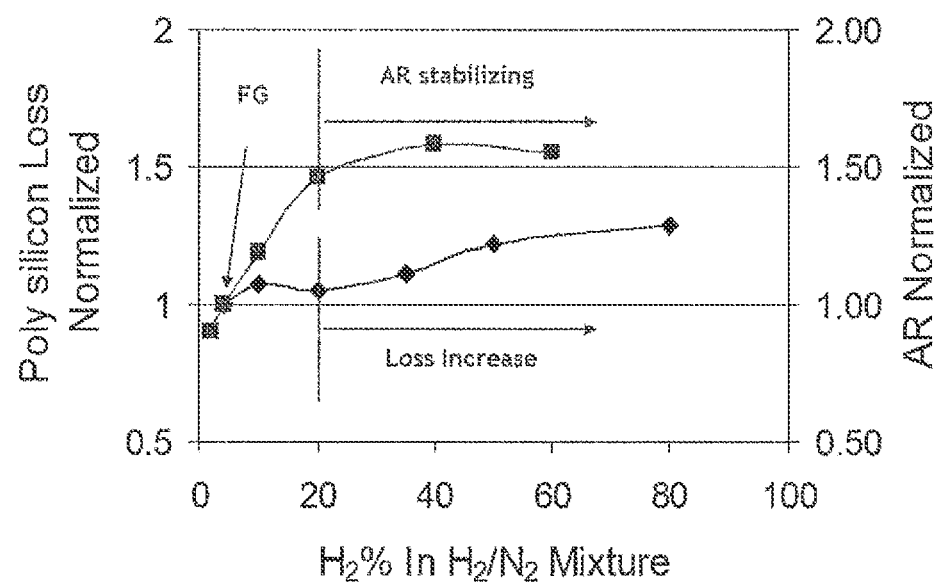
FIG. 3 is a graph depicting the normalized silicon loss based on the percentage of $H_2$ content in a plasma treatment and the aspect ratio.

Using $N_2$ as the carrier gas and $H_2$ as the reactant gas, where the percentage of $H_2$ was varied based of the total volume of the carrier gas and reactant gas combined, a silicon substrate having a normalized aspect ratio of about 1.5 was treated in a plasma reactor having a separate plasma generation chamber and processing chamber. A pair of 300 mm silicon substrates were placed in the processing chamber and were then treated with plasma formed in the plasma generation chamber. The amount of $H_2$ utilized ranged from 0% to about 80%. As shown in FIG. 3, the amount of silicon loss increased as the amount of $H_2$ reactant gas in the $H_2/N_2$ mixture increased beyond 20%.

Example 2

Next, the type of plasma reactor, RF power, and reactant/carrier gas compositions were varied to determine the effect on the ability of the method of the present disclosure to successfully remove photoresist from a pair of 300 mm substrates. The carrier gas in each scenario was $N_2$, while the reactant gas was either $H_2$ or $NH_3$ at a volume of 20% of the total gas volume. One of the plasma reactors utilized is shown in FIG. 1 and is discussed in detail above and had a wall-type gas injection insert (see insert 140 in FIG. 1). The other plasma reactor utilized has a gas injection insert that is a tube as discussed above. The substrates were HAR contact containers having an aspect ratio greater than 50 and a CD less than 0.03 micrometers. For the scenarios tested, the 50:1 aspect ratio holes were successfully cleaned at a commercially viable rate without degrading the metal liner, except some residue remained when the gas injection insert of the plasma source was a tube, 3 kW RF power was used, and the reactant gas was $H_2$. The results are summarized below in Table 1.

TABLE 1

| Reactant/<br>Carrier Gas | Plasma Source/RF Power Source | | | |
|---|---|---|---|---|
| | Tube/5 kW | Tube/3 kW | FIG. 1<br>Wall/5 kW | FIG. 1<br>Wall/3 kW |
| 20% $H_2/N_2$ | Clean | Residue | Clean | Clean |
| 20% $NH_3/N_2$ | — | — | — | Clean |

Example 3

Next, although 20% $H_2/N_2$ and 20% $NH_3/N_2$ were shown in Examples 1 and 2 above to be useful in removing photoresist from HAR contact containers, such Examples do not show the effect of such plasma treatments on the thickness of a TiN substrates. Thus, in Example 3, TiN, which is commonly used as a contact liner, was exposed during photoresist removal using 20% $NH_3/N_2$ as the reactant gas/carrier gas mixture. As shown below in Table 2, the photoresist removal caused TiN thickness losses greater than the stringent specification of less than 0.3 nanometers.

TABLE 2

| Process | TiN Loss (nanometers) |
|---|---|
| Control | 0.317 |
| 20% $NH_3/N_2$ | 0.732 |
| 20% $NH_3/N_2$ | 0.666 |

Example 4

Figure 4:
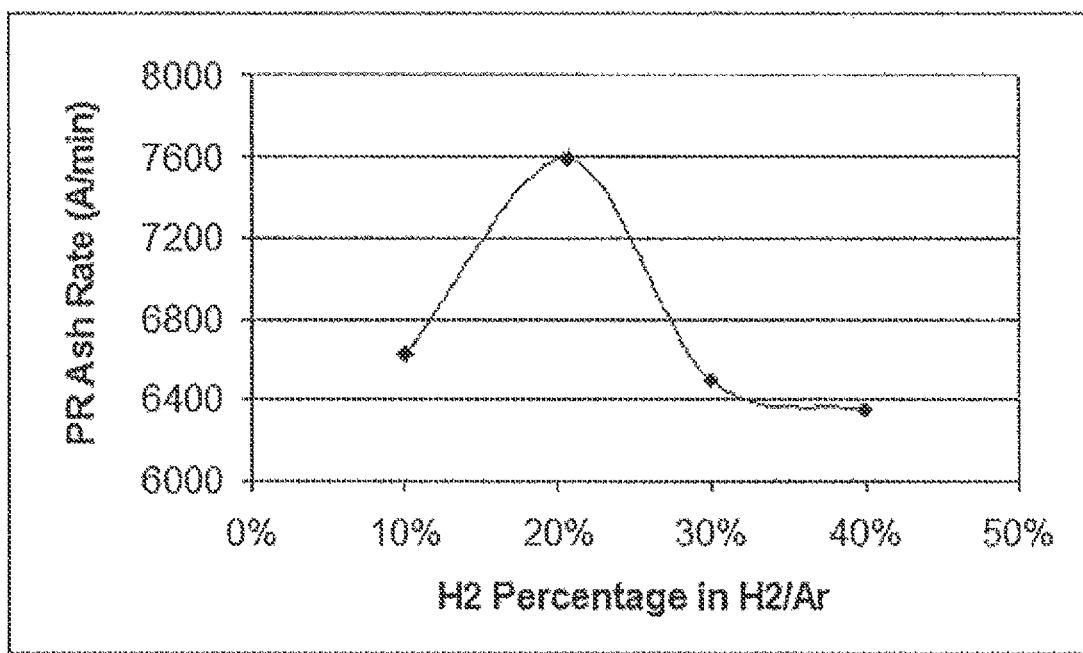
FIG. 4 is a graph depicting the effect of the $H_2$ percentage in an $H_2$/Argon plasma blend on the photoresist removal rate.

Next, because removing photoresist from TiN with 20% $NH_3/N_2$ resulted in TiN loss greater than 0.3 nanometers thick, photoresist removal was then carried out using 20% $H_2$ with Ar instead and at various power levels. The results are summarized in Table 3 below and FIG. 4. FIG. 4 shows that the rate of photoresist removal with $H_2$ and Ar is dependent on the percentage of volume of $H_2$ based on the total volume of the $H_2$ and Ar. As shown in FIG. 4, photoresist removal is most efficient at an $H_2$ percentage of 20%, with the efficiency dropping off at 10% and 30% $H_2$, as measured by the photoresist ash rate. For instance, the ash rate for 20% $H_2$ was about 7600 Angstroms/minute, while the rate for 10% $H_2$ was about 6600 Angstroms/minute and the rate for 30% $H_2$ was about 6500 Angstroms/minute. Meanwhile, Table 3 shows that photoresist removal with 20% $H_2$/Ar limits the TiN loss to less than 0.3 nanometers when the power was less than 5 kW.

TABLE 3

| Process | TiN Loss (nanometers) |
|---|---|
| 20% $H_2$/Ar; 5 kW | 0.322 |
| 20% $H_2$/Ar; 4 kW | 0.196 |
| 20% $H_2$/Ar; 3 kW | 0.149 |

Example 5

Figure 5:
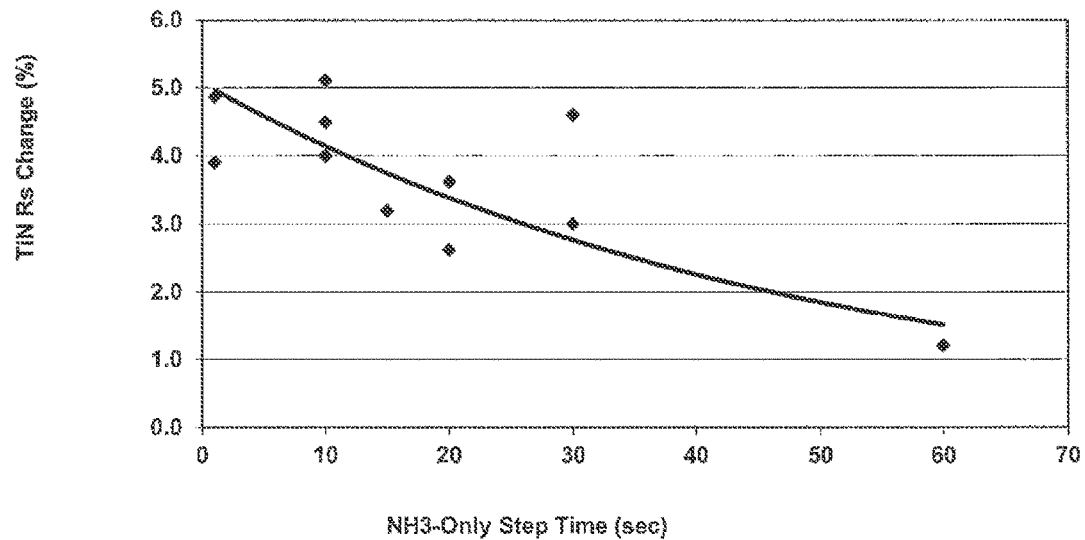
FIG. 5 is a graph depicting the effect of a NH$_3$ only plasma treatment on the sheet resistance (R$_s$) of titanium nitride (TiN) oxidized surface over time.

Next, the ability of the process of the present disclosure to remove an oxidized layer from a conductive material was examined. First, pure $NH_3$ was used to treat a pair of 300 mm conductive substrates containing TiN, where an oxidized layer was present due to a dry plasma treatment of 40% $NH_3/O_2$. As shown in FIG. 5, after treatment with pure $NH_3$ for about 60 seconds, the % change in sheet resistance ($R_S$) of an oxidized TiN substrate was only about 1% after being about 5% at 0 seconds, indicating the $NH_3$ was able to remove some of the oxidation from the TiN substrate. Meanwhile, as summarized in Table 4 below, various reducing chemistries and their effect on TiN loss were tested. As shown, an $O_2$-rich reducing chemistry (10% $NH_3/O_2$) resulted in about a 1.0 nanometer (10 Angstrom) loss when followed by an $NH_3$ post-treatment, compared to a TiN loss of only about 0.4 nanometers for the control.

TABLE 4

| Process | TiN Loss (nanometers) |
|---|---|
| Control | 0.442 |
| 10% $NH_3O_2$ + $NH_3$ Post | 0.995 |

Example 6

Figure 6A:
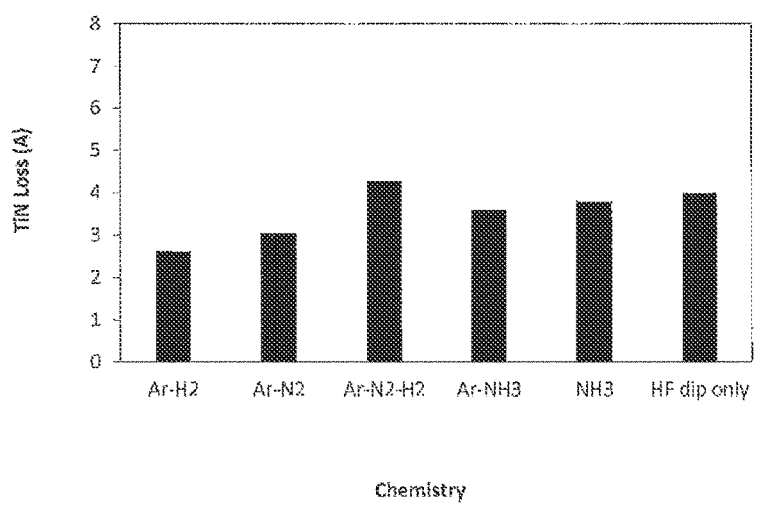
FIG. 6(a) is a graph depicting the amount of TiN loss in Angstroms based on the plasma treatment to which the TiN surface was exposed.
Figure 6B:
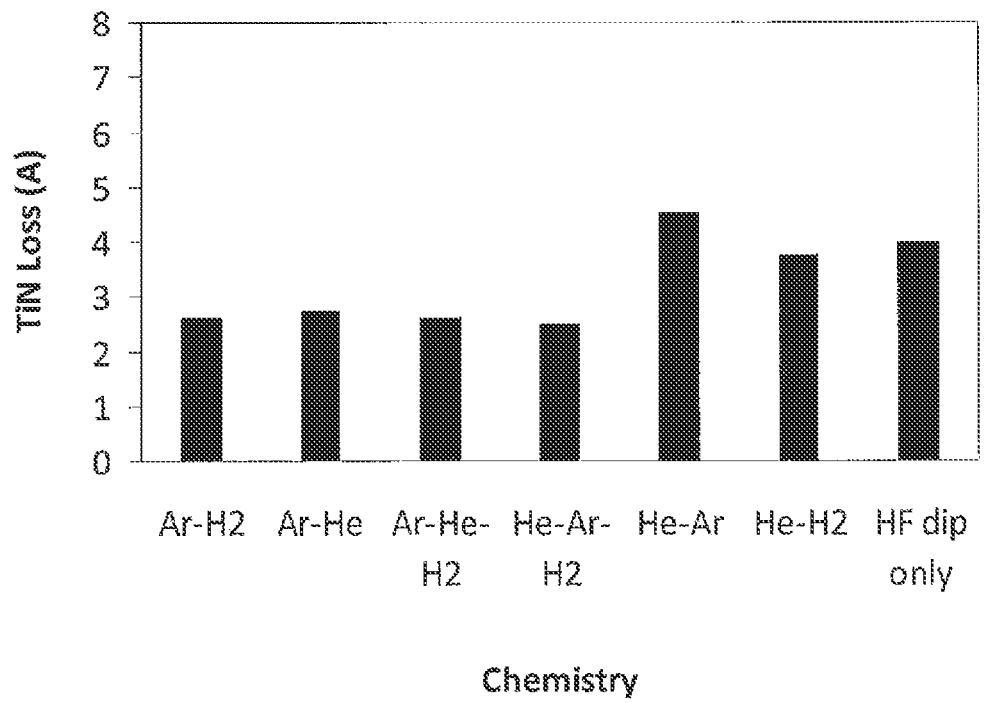
FIG. 6(b) is another graph depicting the amount of TiN loss in Angstroms based on the plasma treatment to which the TiN surface was exposed.

In Example 6, various oxidation layer removal steps were compared. The results are summarized in FIGS. 6(a) and 6(b) and Table 5. As shown in FIGS. 6(a) and 6(b), a controlled sequence, hydrofluoric acid (HF) dip as a wet oxide removal step shows 0.4 nanometer (4 Angstrom) losses of TiN within hours. After this initial HF dip to remove the native oxide, the film thickness for each substrate was measured, and then various other treatments for oxide removal were carried out, as listed below in Table 5, followed by a second HF dip, after which the thicknesses of the substrates were measured so that the TiN loss for the substrates could be compared. Using the HF dip as the baseline, further treatment included exposure of the TiN substrates to various plasmas for 60 seconds at 3 kW RF power. As shown, the least TiN loss (less than about 0.3 nanometers/3 Angstroms) was observed when the TiN substrates were treated with Ar combined with $H_2$, He, or both.

TABLE 5

| Process | TiN Loss (nanometers) |
|---|---|
| HF dip only | 0.4 |
| Ar/$H_2$ (20%) | 0.262 |
| Ar/$N_2$ (20%) | 0.304 |
| Ar/($N_2$/$H_2$ (20%)) 20% | 0.427 |
| Ar/$NH_3$ (20%) | 0.359 |
| $NH_3$ | 0.38 |
| Ar/He (5%) | 0.275 |
| Ar/He (20%)/$H_2$ (20%) | 0.261 |
| He/Ar (20%)/$H_2$ (20%) | 0.251 |
| He (20%)/Ar | 0.454 |
| He/$H_2$ (20%) | 0.377 |

Example 7

In Example 7, the effects of applying $NH_3$ only during various points in the oxidation layer removal process from a TiN film were compared. Depending on the sample, the $NH_3$ was applied at various points in the process: (1) strike, (2) strike and post, and (3) pre-plasma, strike, and post 40% $NH_3/O_2$ dry plasma treatment. The pre-plasma step refers to the point in the process where gas is flowing and temperature/pressure are being controlled, but no RF power has been introduced to create a plasma. This step is generally carried out to stabilize the chamber environment after loading the substrate and can equilibrate the substrate temperature. The strike step refers to point of plasma ignition. Meanwhile, the post-process step refers to the point in the process where chamber pressure is regulated to the level required for substrate exchange and where any reactive gases are purged out prior to opening the chamber door.

Figure 7:
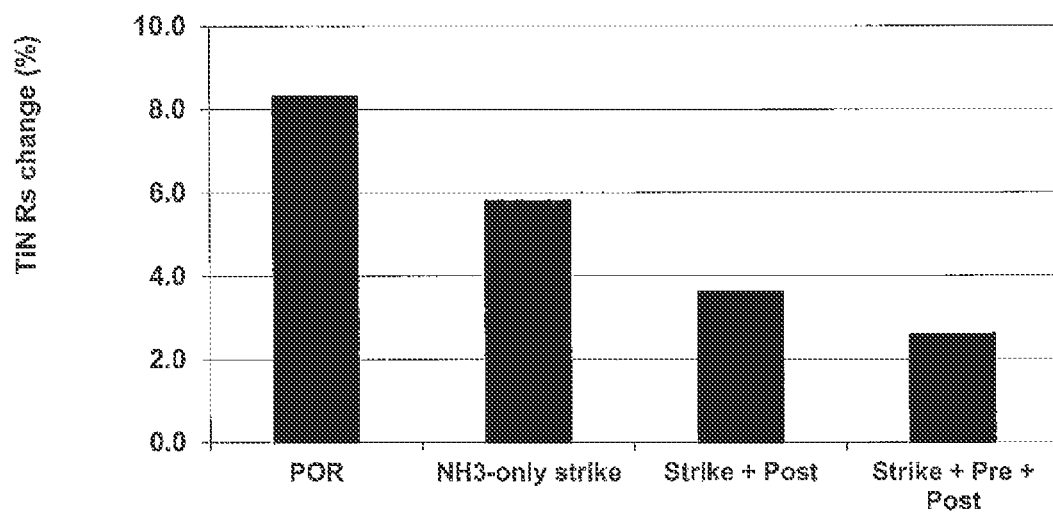
FIG. 7 is a graph depicting the effect of various treatments on the sheet resistance (R$_s$) of titanium nitride (TiN) surface over time.

In FIG. 7, POR refers to the control, which includes 40% $NH_3/O_2$ dry plasma treatment. The reduction in oxidation was measured in terms of percent change in sheet resistance, with the lowest percent change reflecting the highest removal of oxidation from the film with minimal material modification. The results are shown in FIG. 7. As shown, the addition of pre and post processing treatment steps where $NH_3$ was applied significantly reduced the percent change in sheet resistance. The $NH_3$ strike plus pre and post treatment combination was shown to be the most effective at minimizing material modification. However, it should be understood that the same strategy can be used with other plasmas such as $N_2/H_2$, Ar, He, $H_2$, $CH_4$, etc.

Example 8

Next, a combined main stripping process step with a post treatment step was carried out on a TiN liner having holes with an aspect ratio of 50 and a diameter of 0.03 micrometers using a main photoresist removal process with 20% $NH_3/N_2$ (a first non-oxidizing plasma treatment), followed by a 20% $H_2/Ar$ post-main strip treatment (a second non-oxidizing plasma treatment). This was then compared to a 20% $H_2/Ar$ treatment alone. As shown in Table 6 below, these treatments resulted in TiN loss of about 0.3 nanometers or less.

TABLE 6

| Process and Time | TiN Loss (nanometers) |
|---|---|
| 20% $H_2/Ar$ (60 s) | 0.262 |
| 20% $NH_3/N_2$ + 20% $H_2/Ar$ (60 s) | 0.303 |
| 20% $NH_3/N_2$ + 20% $H_2/Ar$ (180 s) | 0.288 |

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for processing a substrate comprising a TiN liner having holes with an aspect ratio of at least 50 and a photoresist layer, the method comprising:

placing the substrate in a processing chamber, the processing chamber located downstream from a plasma chamber;

generating a first non-oxidizing plasma from a first process gas in the plasma chamber, the first process gas comprising a first carrier gas and a first reactant gas, wherein the first process gas comprises from about 10% to about 40% of the first reactant gas, wherein the first reactant gas comprises $NH_3$ and the first carrier gas comprises $N_2$;

exposing the substrate to species of the first non-oxidizing plasma in the processing chamber to implement a strip process for removal of at least a portion of the photoresist layer;

generating a second non-oxidizing plasma from a second process gas in the plasma chamber, the second process gas comprising a second carrier gas and a second reactant gas, wherein the second process gas comprises from about 10% to about 40% of the second reactant gas, wherein the second reactant gas comprises $H_2$ and the second carrier gas comprises Ar;

exposing the substrate to species of the second non-oxidizing plasma in the processing chamber to implement a post-strip treatment process on the substrate.

2. The method of claim 1, wherein the first process gas comprises about 20% of the first reactant gas.

3. The method of claim 1, wherein the second process gas comprises about 20% of the second reactant gas.

4. The method of claim 1, wherein the plasma chamber comprises a dielectric sidewall.

5. The method of claim 4, wherein an induction coil is disposed adjacent the dielectric sidewall.

6. The method of claim 1, wherein the method is carried out at a source power ranging from about 0.4 kilowatts to about 13.5 kilowatts.

7. The method of claim 1, wherein the method is carried out at a pressure ranging from about 100 milliTorr to about 4000 milliTorr.

8. The method of claim 1, wherein the substrate is treated at a temperature ranging from about 150° C. to about 350° C.

9. The method of claim 1, wherein the substrate is treated by exposing the substrate to the species of the first non-oxidizing plasma for a time period ranging from about 10 seconds to about 180 seconds.

10. The method of claim 1, wherein the substrate has a diameter of from about 100 millimeters to about 500 millimeters.

11. The method of claim 1, wherein the strip process comprises a photoresist removal process.

12. The method of claim 1, wherein the species of the first non-oxidizing plasma comprise neutral particles and the species of the second non-oxidizing plasma comprise neutral particles.

* * * * *